US012736580B2

(12) United States Patent
Gunawan et al.

(10) Patent No.: US 12,736,580 B2
(45) Date of Patent: Sep. 15, 2026

(54) PARALLEL DIPOLE LINE PHOTO-HALL SYSTEM WITH TEMPERATURE GRADIENT STAGE

(71) Applicant: INTERNATIONAL BUSINESS MACHINES CORPORATION, Armonk, NY (US)

(72) Inventors: Oki Gunawan, Westwood, NJ (US); Josephine Monica, Ithaca, NY (US); Teodor Krassimirov Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 18/613,533

(22) Filed: Mar. 22, 2024

(65) Prior Publication Data

US 2025/0298072 A1 Sep. 25, 2025

(51) Int. Cl.
*G01R 31/28* (2006.01)
*G01R 1/07* (2006.01)

(52) U.S. Cl.
CPC ........... *G01R 31/2877* (2013.01); *G01R 1/07* (2013.01); *G01R 31/2879* (2013.01)

(58) Field of Classification Search
CPC ........ G01R 33/07; G01R 31/26; G01R 33/12; G01R 33/0017; G01R 33/072; G01R 33/032; G01R 1/07; G01R 31/2877; G01R 31/2879; G01R 33/24; G01R 27/00; G01N 27/72; G01N 21/3563; G01N 27/00; G01N 2015/035; G01N 15/1436; G01N 2011/147
See application file for complete search history.

(56) References Cited

U.S. PATENT DOCUMENTS

| | | | | |
|---|---|---|---|---|
| 6,972,577 | B2 * | 12/2005 | Pfaff | G01R 15/241 324/754.23 |
| 9,041,389 | B2 * | 5/2015 | Gokmen | G01R 33/07 324/252 |
| 9,059,364 | B2 | 6/2015 | Snyder et al. | |
| 9,063,174 | B2 | 6/2015 | Thomas et al. | |
| 10,163,601 | B1 * | 12/2018 | Raveh | H01J 37/073 |
| 10,197,640 | B2 * | 2/2019 | Gunawan | G01R 33/032 |
| 10,942,229 | B2 | 3/2021 | Ausserlechner | |
| 11,486,857 | B2 | 11/2022 | Gunawan et al. | |

(Continued)

FOREIGN PATENT DOCUMENTS

WO 2005017546 A1 2/2005

OTHER PUBLICATIONS

Gunawan et al., "A Parallel Dipole Line System", Applied Physics Letters 106, 062407 (2015), Feb. 2015, pp. 1-24.

(Continued)

*Primary Examiner* — Vinh P Nguyen
(74) *Attorney, Agent, or Firm* — CHIP LAW GROUP

(57) ABSTRACT

A testing system includes a magnetic field generator, an electric field generator and a light source. A temperature control assembly includes a sample stage which supports a device under test during exposure to a magnetic field generated by the magnetic field generator, an electric field generated by the electric field generator and photons from the light source. The temperature control assembly generates a temperature gradient across the device under test to enable measurements sensitive to thermal gradient conditions.

23 Claims, 8 Drawing Sheets

(56) References Cited

U.S. PATENT DOCUMENTS

| | | | | |
|---|---|---|---|---|
| 11,585,871 | B1 * | 2/2023 | Gunawan | G01R 33/072 |
| 11,693,064 | B2 | 7/2023 | Kowal et al. | |
| 2023/0063084 | A1 | 3/2023 | Pham et al. | |

OTHER PUBLICATIONS

Gunawan et al., "Carrier-Resolved Photo Hall Measurement in World-Record-Quality Perovskite and Kesterite Solar Absorbers", arXiv preprint arXiv:1802.07910. Feb. 22, 2018, pp. 1-28.

Gunawan et al., "Carrier-resolved photo-Hall effect", https://doi.org/10.1038/s41586-019-1632-2, Nov. 2019, pp. 151-158.

Young et al., "Direct Measurement of Density-of-States Effective Mass and Scattering Parameter in Transparent Conducting Oxides using Second-Order Transport Phenomena", Journal of Vacuum Science & Technology A Vacuum Surfaces and Films, Mar. 2000, pp. 1-22.

Semilab, https://semilab.com/category/products/ac-field-parallel-dipole-line-hall-measurement, Retrieved Jan. 22, 2024, pp. 1-2.

* cited by examiner

PARALLEL DIPOLE LINE PHOTO-HALL SYSTEM WITH TEMPERATURE GRADIENT STAGE

BACKGROUND

The present invention generally relates to semiconductor testing systems and methods, and more particularly to temperature-controlled photo-Hall systems.

Determining charge carrier information for semiconductor devices technology is needed for device design and testing for applications such as information storage, processing and energy conversion. Understanding the charge carrier properties is a pertinent consideration in developing these applications.

The Hall effect is an important measurement technique in semiconductor research and development. The Hall effect is based on Lorentz force that deflects the flow of charge carriers under a perpendicular magnetic field. This yields three important pieces of information about the charge carriers: the type of carrier (e.g., holes or electrons), the density (n) of carriers and the mobility (μ) of the carriers. While the Hall effect permits the measurement of these quantities, with decreases in device size (node size) and wide-ranging electronics material types, greater sensitivity is needed for semiconductor characterizations.

Therefore, a need exists for systems and methods that provide comprehensive characterization capability with greater sensitivity for characterization of semiconductor devices.

SUMMARY

In accordance with an embodiment of the present invention, a testing system includes a magnetic field generator, an electric field generator or voltage source and a light source. A temperature control assembly includes a sample stage which supports a device under test during exposure to a magnetic field generated by the magnetic field generator, an electric field generated by the electric field generator and photons from the light source. The temperature control assembly generates a temperature gradient across the device under test to enable measurements sensitive to thermal gradient conditions.

In other embodiments, the sample stage can include edge portions which interface with individually controlled temperature elements that provide differential temperatures that result in the temperature gradient across the device under test. The individually controlled temperature elements can include two Peltier stages. The sample stage can include a thermal conductivity and geometry selected to define a temperature profile of the sample stage. The magnetic field generator can include a plurality of parallel dipole line magnets rotatable to control total magnetic field at the device under test. The plurality of parallel dipole line magnets can include one dipole line magnet above the device under test and one dipole line magnet below the device under test. The plurality of parallel dipole line magnets can include two dipole line magnets above the device under test and one dipole line magnet below the device under test. The two dipole line magnets above the device under test can be separated to permit photons from the light source to fall incident on the device under test between the two dipole line magnets. The electric field generator can include circuitry coupled to the device under test. The testing system can directly measure an effective mass of majority carriers of the device under test.

In accordance with another embodiment of the present invention, a testing system includes a parallel line dipole photo-Hall system to measure conductivity, Hall effect, Seebeck effect and Nernst effect. The parallel dipole line photo-Hall system includes a temperature control assembly having a sample stage which supports a device under test, portions of an intermediary stage, each portion of the intermediary stage separately supporting an end portion of the sample stage; and temperature controlled stages, each interfacing with the portions of the intermediary stage. The temperature-controlled stages individually control respective end portions of the sample stage to generate a temperature gradient across the device under test.

In other embodiments, the sample stage can include a thermal conductivity and geometry selected to define a temperature profile of the sample stage. The parallel line dipole photo-Hall system can include a magnetic field generator having a plurality of parallel dipole line magnets rotatable to adjust a magnetic field at the device under test. The plurality of parallel dipole line magnets can include one dipole line magnet above the device under test and one dipole line magnet below the device under test. The plurality of parallel dipole line magnets can include two dipole line magnets above the device under test and one dipole line magnet below the device under test. The two dipole line magnets above the device under test can be separated to permit photons from a light source to fall incident on the device under test between the two dipole line magnets. The testing system can directly measure an effective mass of majority carriers of the device under test. The temperature controlled stages can each be contacted by a temperature-controlled heatsink.

In accordance with another embodiment of the present invention, a testing system includes a processor and memory coupled to the processor. A magnetic field generator is controlled by the processor to a generate a two-dimensional magnetic field vector on a device under test. A circuit is disposed on the device under test to generate an electric field or current controlled by the processor. A light source is controlled by the processor to direct light at the device under test. A temperature control assembly includes a sample stage which supports the device under test, the temperature control assembly being controlled by the processor to generate a temperature gradient across the device under test to enable measurements sensitive to thermal gradient conditions.

In other embodiments, the sample stage can include edge portions which interface with individually controlled temperature elements that provide differential temperatures that result in the temperature gradient across the device under test. The magnetic field generator can include a plurality of parallel dipole line magnets rotatable to adjust a magnetic field at the device under test. The testing system can directly measure an effective mass of majority carriers of the device under test.

In accordance with another embodiment of the present invention, a method for measuring a semiconductor device includes subjecting a device under test to a magnetic field, an electric field and photons from a light source; and generating a temperature differential across the device under test by maintaining temperatures across a sample stage which supports the device under test during the subjecting to enable measurements sensitive to thermal gradient conditions.

In other embodiments, the sample stage can include edge portions which interface with individually controlled temperature elements that provide differential temperatures that result in a temperature gradient across the device under test.

The method can measure conductivity, Hall effect, Seebeck effect and Nernst effect to determine an effective mass of majority carriers of the device under test.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
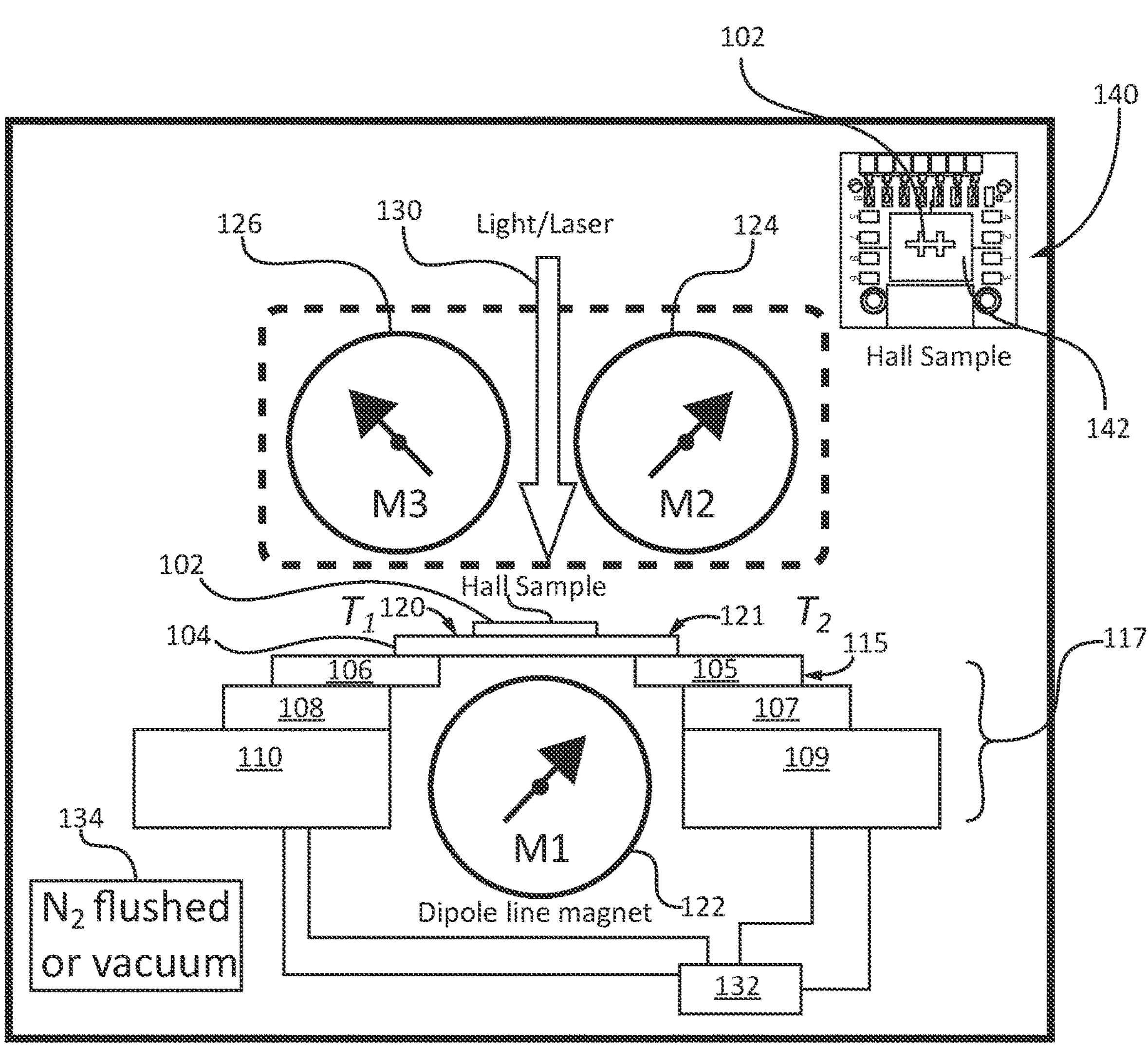
FIG. 1 shows a schematic cross-sectional view of a testing system having four excitation modes including magnetic, electric, photonic and temperature gradient, in accordance with an embodiment of the present invention.

In accordance with embodiments of the present invention, systems and methods are described which provide measurements for carriers on semiconductor devices. In an embodiment, a testing system includes a Hall effect measurement fixture with differential temperature capability. Differential temperature capability refers to the ability to hold different temperatures at different locations across a semiconductor device under test (DUT). In some embodiments, the differential temperature includes two temperatures one on each side of the device under test. This produces a temperature gradient across the device under test. A temperature gradient can reveal additional characteristics for the device under test. For example, if excitations of the device under test include an electric field (E), a magnetic field (B), a temperature gradient across the device under test and a light or photonic source ($\gamma$), the measurement of an effective mass of majority carriers can be obtained. The effective mass of majority carriers can be measured, e.g., by measuring the conductivity ($\sigma$), Seebeck coefficient ($\alpha$), the Hall coefficient (H) and the Nernst coefficient (Q). Other measurements can also be made.

In accordance with embodiments of the present invention, a testing system includes a sample fixture which supports a device under test (e.g., a Hall sample). The sample fixture is supported by conductive stages, which separately support the sample fixture at different locations. The locations at which the fixture is supported have independently controlled temperatures. The independently controlled temperatures provide one or more temperature gradient possibilities across the device under test. The testing system includes a parallel dipole line system, which can include two or more magnets to provide a magnetic field relative to the device under test. The magnetic field can be adjusted but includes application of a magnetic field that can fluctuate between in-plane and/or perpendicular to the device under test. The testing system further includes electrical circuitry to enable an electric field for Hall effect measurements. A light or laser source is included to direct photons at the device under test. The photons can be incident to the device under test perpendicular or at an angle. While perpendicularly incident light permits ease of thermal imaging, the light source can employ a lens system or optical waveguide such as fiber cable to deliver the light at an angle.

The device under test is mounted on a thermally conductive stage. It is then mounted on a pair of temperature-controlled stages to permit temperature control of the test sample. The temperature-controlled stage can be coupled to coolant blocks. The coolant blocks can permit a high degree of temperature control to accurately maintain a temperature differential of independently controlled positions across the device under test. The cooling blocks or heatsink can include a chamber, tubes or channels in which a coolant or fluid flows. The cooling blocks can be formed from a high thermal conductive material, such as, e.g., copper. In other embodiments, a chiller can also be employed to maintain a constant temperature across the entire device under test (e.g., for variable fixed temperature measurements). The plurality of excitation modes including the temperature gradient provide greater sensitivity to improve semiconductor characterizations.

Referring now to the drawings, in which, like numerals represent the same or similar elements and initially to FIG. 1, a schematic diagram shows a testing system 100 in accordance with an embodiment. The testing system 100 includes a sample stage or fixture 104 which supports a device under test 102. The device under test 102 can be part of the testing system but can also be an independent test sample or a semiconductor device to be characterized. The device under test 102 is also depicted in inset 140. The device under test 102 can include a semiconductor device 142 to be tested and include a Hall sensor in accordance with the present embodiments. If the Hall effect is to be measured, the device under test 102 can be connected to circuitry employed to generate an electric field E through the device under test 102. Said differently, the device under test 102 can be wired to generate an electric field E.

A magnetic field is generated by dipole line magnets M1, M2, M3. The dipole line magnets M1, M2, M3 are disposed within rotatable cylinders 122, 124, 126, which are rotated to generate rotating the magnetic field B in a controlled manner relative to the device under test 102. For example, the rotation and distance from the device under test 102 can be selected to oscillate the magnetic field between and in-plane magnetic field and a perpendicular magnetic field relative to the device under test 102.

A photon source 130, such as a laser, light emitting diode or other light source can be arranged to direct photons at the device under test 102. The photon source 130 can have photons directed to the device under test in a perpendicular manner as shown in between magnets M2 and M3, or the photon source 130 can have photons directed by a path that is at an angle with a surface of the device under test 102. If the path is at an angle, the photons will be directed using a waveguide, lenses or other optical equipment capable of guiding the photons as needed.

The sample fixture 104 includes a material capable of supporting a temperature gradient parallel to a plane of the device under test 102. In an embodiment, the sample fixture 104 includes a thermally non-conductive material to establish a temperature gradient across the device under test 102. For example, sample fixture 104 can include glass, plastic, ceramics or other thermally non-conductive materials or a metal plate covered by an insulating layer.

The sample fixture 104 is supported at edge portions 120, 121 by conductive stages or portions 105, 106 of an intermediate stage 115. A length of the sample fixture 104 in contact with the portions 105, 106 as well and a distance between the edge portions 120, 121 to the device under test 102 are factors to be considered for establishing a temperature gradient across the device under test 102. The sample fixture 104 can include an attachment mechanism to mount the device under test 102.

The sample fixture 104 is supported at edge portions 120, 121. An unsupported central portion of the sample fixture 104 permits access to an underside of the sample fixture 104 by magnet M1. The edge portions 120, 121 have independently controlled temperatures. For example, edge portion 120 can be controlled at temperature $T_1$, while edge portion 121 can be controlled at temperature $T_2$, where $T_1$ and $T_2$ are not equal and provide the temperature gradient across the device under test 102. The device under test 102 can be arranged in different orientations to set up temperature gradients across different directions relative to the device under test 102.

The sample fixture 104 can be supported by portions 105, 106 of an intermediate stage 115. The portions 105, 106 of the intermediate stage 115 can include a highly thermally conductive material, e.g., Aluminum or other thermally conductive metal. The portions 105, 106 of the intermediate stage 115 are separate from one another to support different temperature between the portions 105 and 106. The portions 105, 106 of the intermediate stage are adjustable to change an amount of contact with the edge portions 120, 121 of the sample fixture 104 and a support length (e.g., a length unsupported between portions 105 and 106) of the sample fixture 104. The portions 105, 106 of the intermediate stage 115 interface with a temperature controlled stage 117. The temperature-controlled stage 117 can include one or more temperature control mechanisms. In an embodiment, a Peltier stage or stages 107, 108 can be employed to adjust temperatures to achieve $T_1$ and $T_2$ to create a temperature gradient across the device under test 102. The temperature-controlled stage 117 can include a positioning mechanism to adjust a position of the device under test 102. The temperature-controlled stage 117 includes two or more separate portions that can include independently controlled temperatures to provide the temperature gradient across the device under test 102. In an embodiment, two double-layer Peltier stages 107, 108 can be employed, with, e.g., a power=10 Watts, ΔTmax=90° C., Tmax=80° C. and Tmin=−40° C.

The temperature-controlled stage 117 can be mounted on a thermally conductive block 109, 110. The blocks 109, 110 provide mass to increase thermal stability and make it easier to maintain a controlled temperature setting. In an embodiment, the blocks 109, 110 can include a metal, such as copper or the like. The blocks 109, 110 can have a temperature maintained using, e.g., liquid chillers 132 to serve as a constant temperature heatsink. The blocks 109, 110 can include a chamber, tubes or channels in which a coolant or fluid flows. The blocks 109, 110 can be formed from a high thermal conductive material, such as, e.g., copper. In other embodiments, the liquid-chiller or chillers 132 can also be employed (along with or instead of the Peltier stages 107, 108) to maintain a constant temperature across the entire device under test 102 (e.g., variable fixed temperature, no gradient). The liquid-chiller or chillers 132 can be independently employed (with or without other temperature controlling devices) to provide different temperature to portions 105 and 106.

In an embodiment, the temperature of the blocks 109, 110 is maintained at a middle temperature between Tmax and Tmin of the Peltier stages 107, 108, e.g., $T_{heatsink}$=20° C. In an embodiment, the temperature differential between Tmax and Tmin of the Peltier stages 107, 108 can be up to + or −120° C. This is sufficient for observation of Seebeck and Nernst effects in most materials. During operation and measurement, an area surrounding the device under test 102 can be flushed with an inert gas, e.g., $N_2$, Ar, or the like, using a gas delivery system 134. It is also possible to create a vacuum inside the chamber.

The testing system 100 integrates many possible excitation modes, e.g., electric field (E), magnetic field (B), photons and differential temperature. This permits measurement of Seebeck and Nernst effects along with other parameters. The testing system can also function as a variable fixed temperature system with a range of at least −40° C. to 80° C. and vibration-free.

Figure 2:
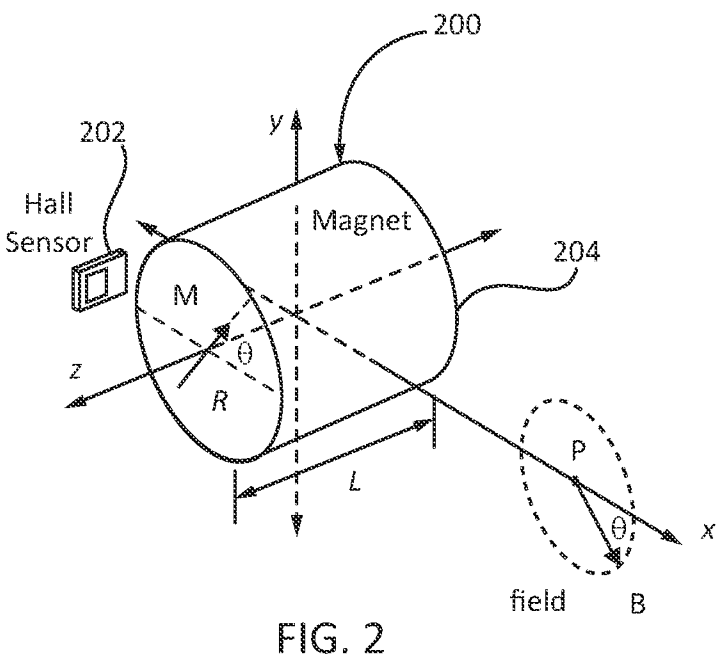
FIG. 2 shows a perspective view of a parallel dipole line magnet generating a magnetic field, in accordance with an embodiment of the present invention.

Referring to FIG. 2, a parallel dipole line (PDL) magnet 200 is illustratively shown in accordance with an embodiment. PDL magnet 200 is disposed within a cylinder of radius R and length L. The PDL magnet 200 includes an alternating current (AC) that creates an AC magnetic field B, which is useful for lock-in detection of a Hall signal, which can be measured by a Hall sensor 202. The magnet 200 is shown within a cartesian coordinate system with x, y and z directions indicated. A magnet with magnetization vector M is rotated about the z axis, e.g., by θ to generate a magnetic field B at a position P and rotated by θ relative to the x axis.

Figure 3:
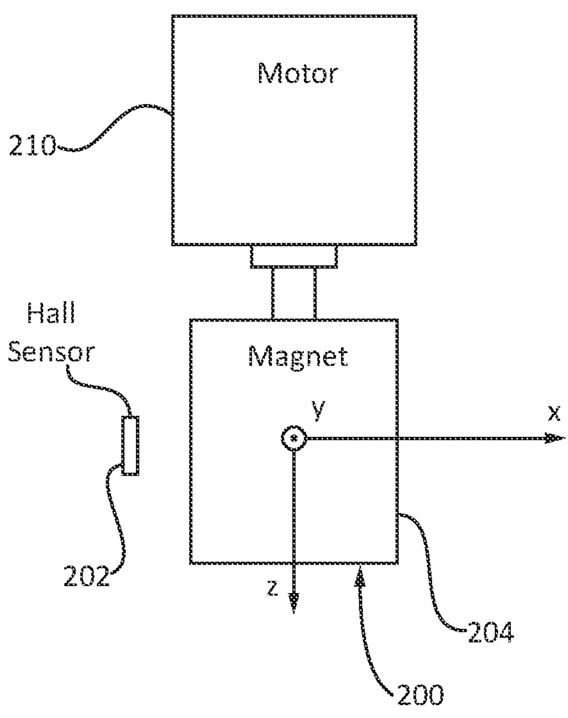
FIG. 3 shows a side view of a parallel dipole line magnet coupled to a motor for rotating the parallel dipole line magnet to generate a controlled magnetic field, in accordance with an embodiment of the present invention.

Referring to FIG. 3 with continued reference to FIG. 2, the magnet 200 is rotated to make adjustment to the magnetic field at or around a device under test. The device under test (Hall sensor 202 in this case) should be centered along the length L of the cylinder 204. The cylinder 204 can be rotated using a motor 210. The magnetic dipole vector M can be adjusted, and along with other rotatable magnets, can create a resultant two-dimension magnetic field. In accordance with embodiments of the present invention, different magnet configurations can be employed to permit any two-dimensional vector magnetic field.

Figures 4, 5:
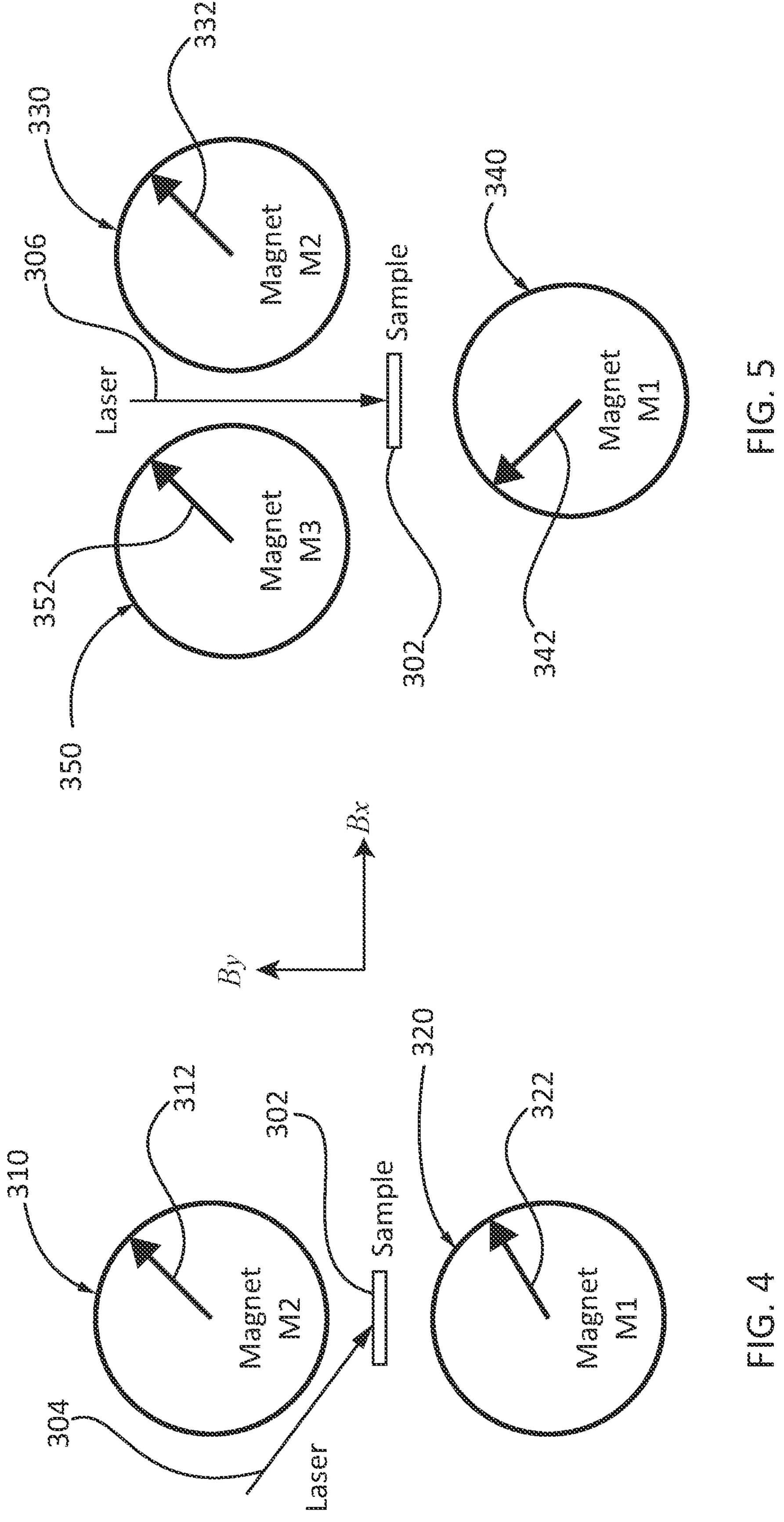
FIG. 4 shows a side view of parallel dipole line magnets in a two-magnet configuration, in accordance with an embodiment of the present invention.
FIG. 5 shows a side view of parallel dipole line magnets in a three-magnet configuration, in accordance with an embodiment of the present invention.

Referring to FIG. 4, in an embodiment, a two-magnet configuration includes PDL magnets disposed in cylindrical housings 310, 320 to provide a resultant magnetic field vector by vector addition of vectors 312, 322, respectively. The cylindrical housings 310, 320 are located above and below a device under test 302. In an embodiment, center-lines of the cylindrical housings 310, 320 can be lined up with a center of the device under test 302. The vectors 312 and 322 can generate any 2D vector magnetic field, in particular, can vary between an in-plane magnetic field ($B_x$) for the device under test 302 or a perpendicular magnetic field ($B_y$) for the device under test 302. It should be noted that if photonic excitation is employed, a light beam 304 needs to be directed at an angle to fall incident on the device under test 302 to avoid the cylinder housing 310.

Referring to FIG. 5, in another embodiment, a three-magnet configuration includes PDL magnets disposed in cylindrical housings 330, 340, 350 to provide a resultant magnetic field vector by vector addition of vectors 332, 342, 352, respectively. The cylindrical housings 330, 350 are located above the device under test 302 leaving a gap therebetween to permit a light beam 306 to pass therethrough. This makes thermal imaging for analysis of the device under test 302 easier. The cylindrical housing 340 is located below the device under test 302. The vectors 332, 342 and 352 can generate any 2D vector magnetic field, in particular, can vary between an in-plane magnetic field ($B_x$) for the device under test 302 or a perpendicular magnetic field ($B_y$) or out-of-plane magnetic fields in any direction relative to the device under test 302.

While the three magnet configuration provides a higher maximum magnetic field, there is also a higher amount of torque needed to rotate the magnets. This can cause slippage on the motors used to turn the cylinder housings 330, 340, 350. The three-magnet configuration can also be more complicated to control when compared to the two-magnet configuration.

Figure 6:
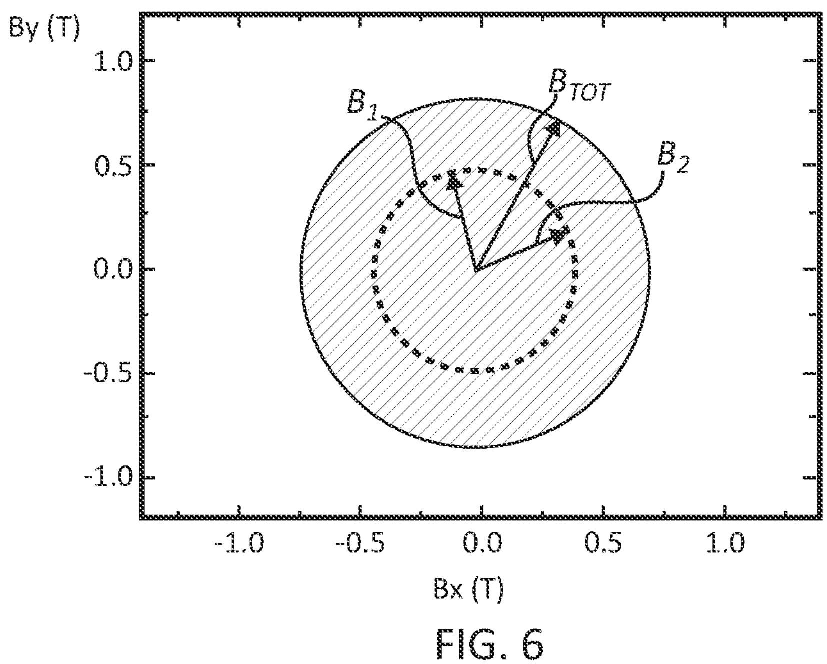
FIG. 6 shows a plot of y direction magnetic field versus x direction magnetic field for a two magnet configuration, in accordance with an embodiment of the present invention.

Referring to FIG. 6, a plot of magnetic field vectors $B_1$ and $B_2$ for magnets M1 and M2 respectively in the configuration of FIG. 4 is shown. The y-axis plots magnetic field component, $B_y$, in Tesla while the x-axis plots magnetic field component, $B_x$, in Tesla. The magnetic field vectors $B_1$ and $B_2$ will add up resulting in "total" magnetic field vector $B_{TOT}$. The workspace of possible field vectors generated is shown as the shaded region in FIG. 6. Distances between the device under test and between magnets needs to be chosen such that it can generate the desired magnetic field.

Figure 7:
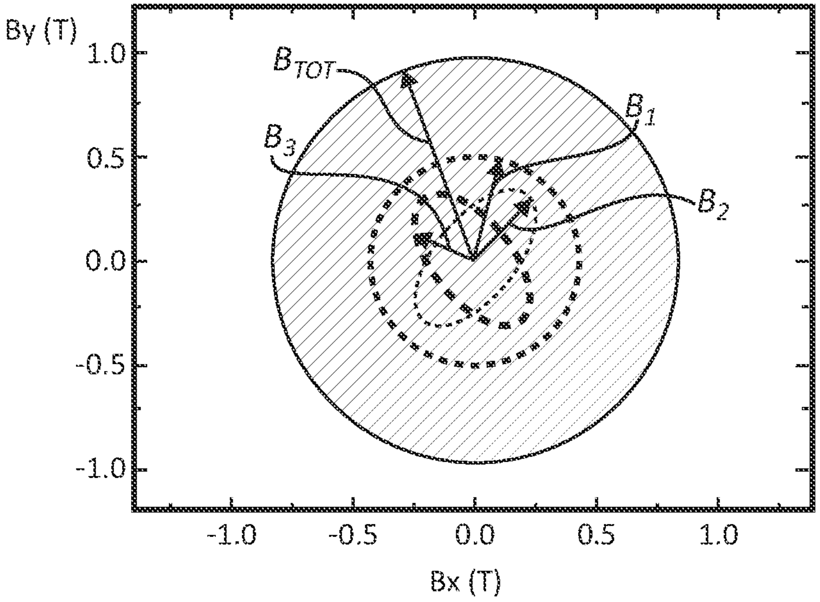
FIG. 7 shows a plot of y direction magnetic field versus x direction magnetic field for a three-magnet configuration, in accordance with an embodiment of the present invention.

Referring to FIG. 7, a plot of magnetic field vectors $B_1$, $B_2$ and $B_3$ for magnets M1, M2 and M3 in the configuration of FIG. 5 is shown. The y-axis plots magnetic field component, $B_y$, in Tesla while the x-axis plots magnetic field component, $B_x$, in Tesla. The magnetic field vectors $B_1$, $B_2$ and $B_3$ will add up and make a "total" magnetic field vector $B_{TOT}$ that is larger in magnitude than the two-magnet configuration. The workspace of possible field vectors is shown as the shaded regions in FIG. 7. Distances between the device under test and between magnets needs to be chosen such that it can generate the desired magnetic field.

Figure 8:
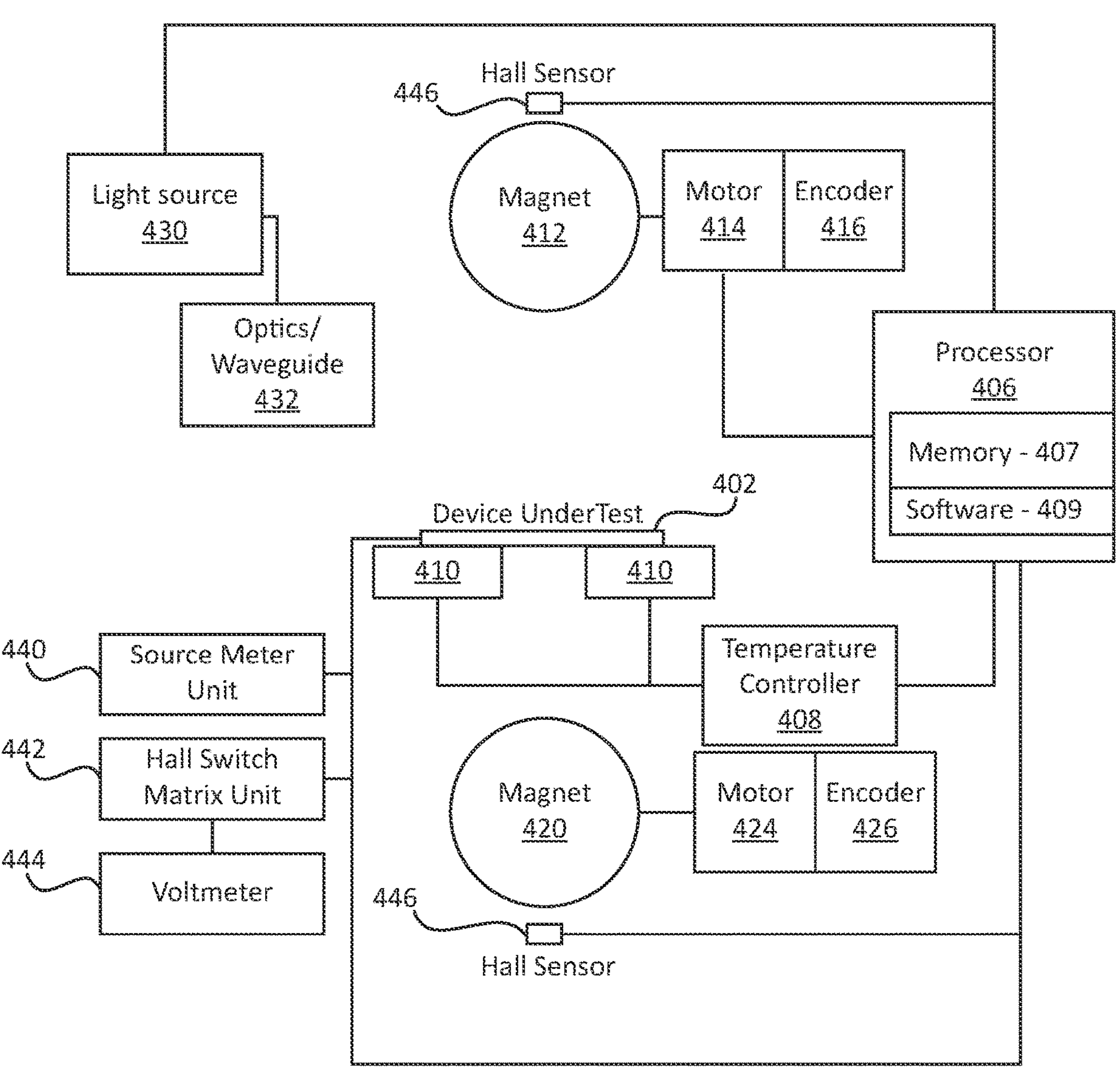
FIG. 8 shows a block diagram of a testing system including a processor and memory configured to control some or all of the systems for the testing, in accordance with an embodiment of the present invention.

Referring to FIG. 8, a block diagram shows a testing system 400 having excitation modes that include magnetic, electric, photonic and temperature gradient in accordance with an embodiment of the present invention. The testing system 400 includes a parallel dipole line system to generate magnetic fields using magnets arranged so that the magnet field is radially outward. Magnets 412 and 420 are controlled by respective motors 414, 424. Testing system 400 illustratively employs a two-magnet configuration, but a three or more magnet configuration can also be employed. Motors 414, 424 can include encoders 416, 426 to measure rotational positions of the motors 414, 424. The encoders 416, 426 are particularly useful to identify if the motors 414, 424 have slipped due to the magnetic resistance forces. Motors 414, 424, encoders 416, 426 and therefore magnets 412 and 420 can be controlled using a processor 406. In some embodiments, a steeper motor controller can be employed to control the motion of the motors 414, 424. Magnetic fields (B) can be measured using Gauss sensors or Hall sensors 446 or the like as feedback to make needed adjustments relative to a position of a device under test 402 to the magnet strength (e.g., using AC current), positions of the magnets through rotations, etc.

The device under test can include circuitry (e.g., a Hall sensor) to generate an electric field (E) relative to the device under test 402. A source meter unit 440 can provide electric power and signals to the device under test 402. Electrical signals (e.g., voltage or current) to and from the Hall sensor can be controlled using the processor 406, which, in turn, can employ a Hall switch matrix unit 442 or the like to control functions for measurements on the device under test 402. Feedback devices, such as a voltmeter 444 can be employed to monitor changes and states on the device under test 402. These devices (440, 442, 444) can be controlled by the processor 406 and employed to generate an electric field on the device under test 402. An electric field can be generated by an electric field generator, such as, e.g., a voltage or current source.

A light or laser source 430 is included to direct photons ($\gamma$) at the device under test 402. The photons can be incident to the device under test 402 perpendicular or at an angle. Angularly incident photons can employ a lens system or optical waveguide 432, such as fiber optics, to deliver the light beam at an angle and with enlarged cross sections to cover the sample.

A temperature gradient can be induced to the device under test 402 using temperature elements 410 which can be similar to temperature controlled stage 117. The temperature elements 410 can include heaters (e.g., electric resistance heaters), cooling elements (e.g., liquid-controlled chilling) or combinations of these. In an embodiment, the temperature elements 410 can include Peltier stages. The temperature elements 410 can be individually controlled using a temperature controller 408. The temperature controller 408 control temperature times and magnitudes to generate a desired temperature gradient across the device under test 402.

It should be understood the control of various components of the testing system 400 can be handled by specific controllers (e.g., stepper motor controller, temperature controller optics/waveguides 432, light source 430, motors 414, 424, magnets 412, 420, etc.). However, these and other components can be controlled by the processor 406. The processor 406 has an associated memory 407 which can store software 409 to permit control, adjustment and storage functions for all components. Measurements made using the testing system 400 can be saved to the memory 407. In an embodiment, the software 409 can include data analysis capabilities to perform lock-in detection of detected AC signals for the Hall effect and the Seebeck effect. The lock-detection technique permits recovery of small, desired signals buried in large background noise by extracting the signal with the same frequency and phase of the applied excitation. The excitation could be an oscillating magnetic field or oscillating temperature. This assists in providing greater sensitivity needed for semiconductor characterizations.

Exemplary applications/uses to which the present invention can be applied include, but are not limited to semiconductor device testing. Semiconductor devices can include processors, memory devices, application specific integrated circuits (ASICs), logic circuits or devices, combinations of these and any other circuit device. In such devices, one or more semiconductor devices can be included in a central processing unit, a graphics processing unit, and/or a separate processor- or computing element-based controller (e.g., logic gates, etc.). The semiconductor devices can include one or more on-board memories (e.g., caches, dedicated memory arrays, read only memory, etc.). In some embodiments, the semiconductor devices can include one or more memories that can be on or off board or that can be dedicated for use by a hardware processor subsystem (e.g., ROM, RAM, basic input/output system (BIOS), etc.).

In some embodiments, the semiconductor devices can include and execute one or more software elements. The one or more software elements can include an operating system and/or one or more applications and/or specific code to achieve a specified result. In still other embodiments, the semiconductor devices can include dedicated, specialized circuitry that perform one or more electronic processing functions to achieve a specified result. Such circuitry can include one or more field programmable gate arrays (FPGAs), and/or programmable applications programmable logic arrays (PLAs).

The testing system 400 employs magnetic, electric, photonic and temperature gradient excitation modes to be able to measure conductivity, the Hall effect, the Seebeck effect and the Nernst effect.

To compute the effective mass of majority carriers the following equation can be employed according to Young et al. (J. Vac. Sci. & Tech A 18, 2978, 2000):

$$m^* = \left(\frac{3}{|H|q\pi}\right)^{2/3} \frac{q\hbar^2}{k_{B2}T}\left(\alpha - \frac{Q}{|H|\sigma}\right),$$

where H is the hall coefficient, q is the magnitude of electron charge, $k_B$ is Boltzmann's constant, $\hbar$ is Planck's constant, Tis the absolute temperature, $\alpha$ is Seebeck's coefficient, Q is Nernst's coefficient and $\sigma$ is conductivity (van der Pauw).

Conductivity can be computed as $$\sigma = \frac{q^2 n}{m^*}\langle\tau\rangle,$$

where n is carrier density, and $\tau$ is a tensor representation of relaxation time, e.g., $\tau=1/(k^*T)$ where $\tau$ (tau) represents the relaxation time, k is a proportionality constant that depends on the specific process being studied, and Tis the temperature of the system.

The Seebeck coefficient can be computed as $$\alpha = \frac{-1}{qT}\left[\frac{\langle\tau E\rangle}{\langle\tau\rangle} - E_F\right],$$

where E is the carrier energy and $E_F$ is Fermi energy.

The Hall coefficient can be computed as $$H = \frac{-1}{nq}\left[\frac{\langle\tau^2\rangle}{\langle\tau\rangle^2}\right].$$

The Nernst coefficient can be computed as $$Q = \frac{-\mu_n}{qT}\left[\frac{\langle\tau^2 E\rangle}{\langle\tau\rangle^2} - \frac{\langle\tau^2\rangle\langle\tau E\rangle}{\langle\tau\rangle^3}\right],$$

where $\mu_n$ is electron mobility.

Mobility and effective mass are related as:

$$\mu = \frac{e\tau}{m^*},$$

where e is the mass of an electron.

By employing the testing system in accordance with embodiments of the present invention, the Hall coefficient (H), Seebeck's coefficient ($\alpha$), Nernst's coefficient (Q) and van der Pauw's conductivity ($\sigma$) can be measured and evaluated directly. This permits direct measurement of majority carrier effective mass (m*).

Figure 9:
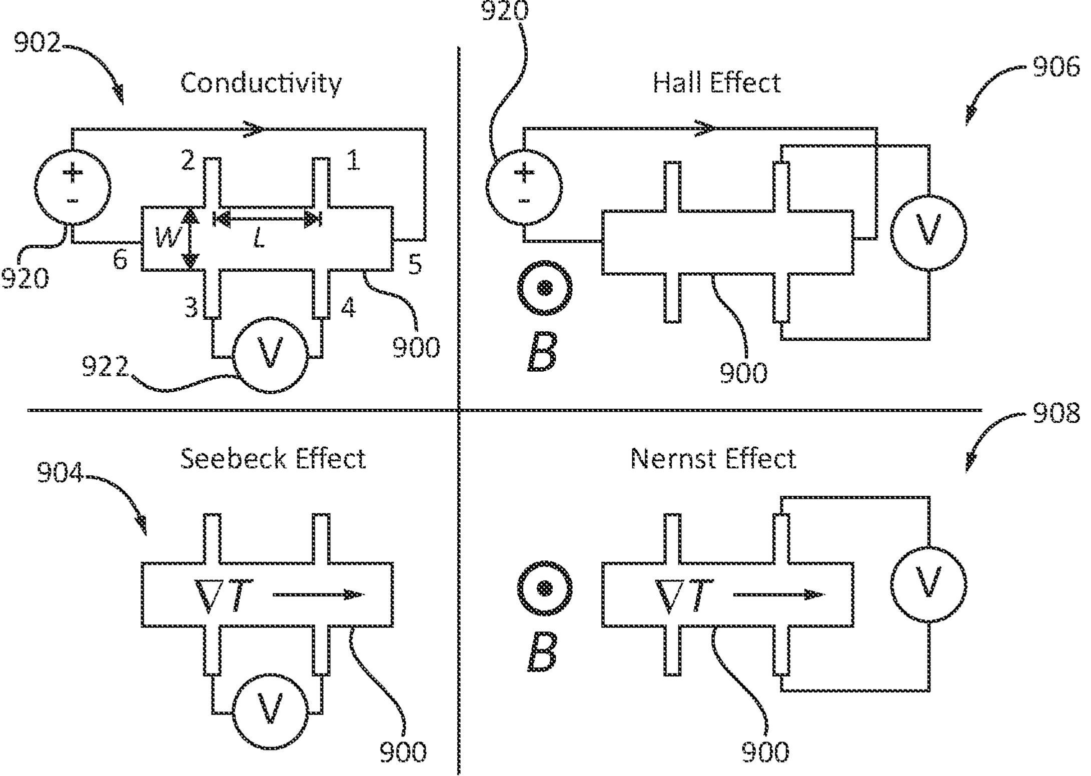
FIG. 9 shows setup diagrams of the testing system for measuring conductivity, Hall effect, Seebeck effect and Nernst effect, in accordance with an embodiment of the present invention.

Referring to FIG. 9, setups for measuring the Hall coefficient (H), Seebeck's coefficient ($\alpha$), Nernst's coefficient (Q) and van der Pauw's conductivity ($\sigma$) are illustratively shown. A Hall sensor 900, (device under test) is employed and set up so as to measure these coefficients under four excitation modes. The excitation modes include electric field, magnetic field, photon excitation and temperature gradient. Conductivity ($\sigma$) is measured on the device under test or Hall sensor 900 by measuring the longitudinal resistance $R_{xx}$ in configuration 902. The formula: $\sigma=LI_S/V_{XX}Wt_S$, where L and W are the length and the width of the device under test active area respectively, $I_S$ is the current flowing to the device and $t_S$ is the thickness of the device.

Points 1 and 2 or 3 and 4 are connected for longitudinal (resistance) measurement, and points 1 and 4 are connected for transverse (resistance) measurement $R_{xy}$. A voltage or current source 920 is applied across points 5 and 6, and a voltmeter is applied across points 1 and 2 or 3 and 4. In configuration 906, the Hall coefficient (H) is measured in a perpendicular magnetic field B from the measurement of the transverse or Hall voltage $V_{xy}$, given as: $H=R_{XY}\,t_S/B$ where $t_s$ is the sample thickness.

The Seeback effect in configuration 904 and the Nernst effect in configuration 908 are measured in a temperature gradient ($\nabla$T). For the Seebeck effect, the voltage V is applied transversely across the Hall sensor 900 in under a temperature gradient. For the Nernst effect the voltage source Vs is applied longitudinally across the device under test or Hall sensor 900 under a perpendicular magnetic field, B, and under a temperature gradient. The effective mass of the majority carrier can be measured directly in accordance with the present embodiments. By adding light, the system can also be utilized to measure both electron and hole mobility lifetime and diffusion length, e.g., performing a carrier-resolved photo Hall effect.

The testing systems with differential temperature control measure conductivity, Hall, Seebeck and Nernst effects. The testing systems can include two or more independent controllable temperature stages to apply differential temperatures. The testing systems can include 2 or 3 independent parallel dipole line PDL magnets to generate two-dimensional AC magnetic field useful for separating Hall effect and other magnetoresistance effects. The testing systems are capable of measuring comprehensive sets of semiconductor parameters including but not limited to conductivity, Hall coefficient, Seebeck coefficient and Nernst coefficient.

Figure 10:
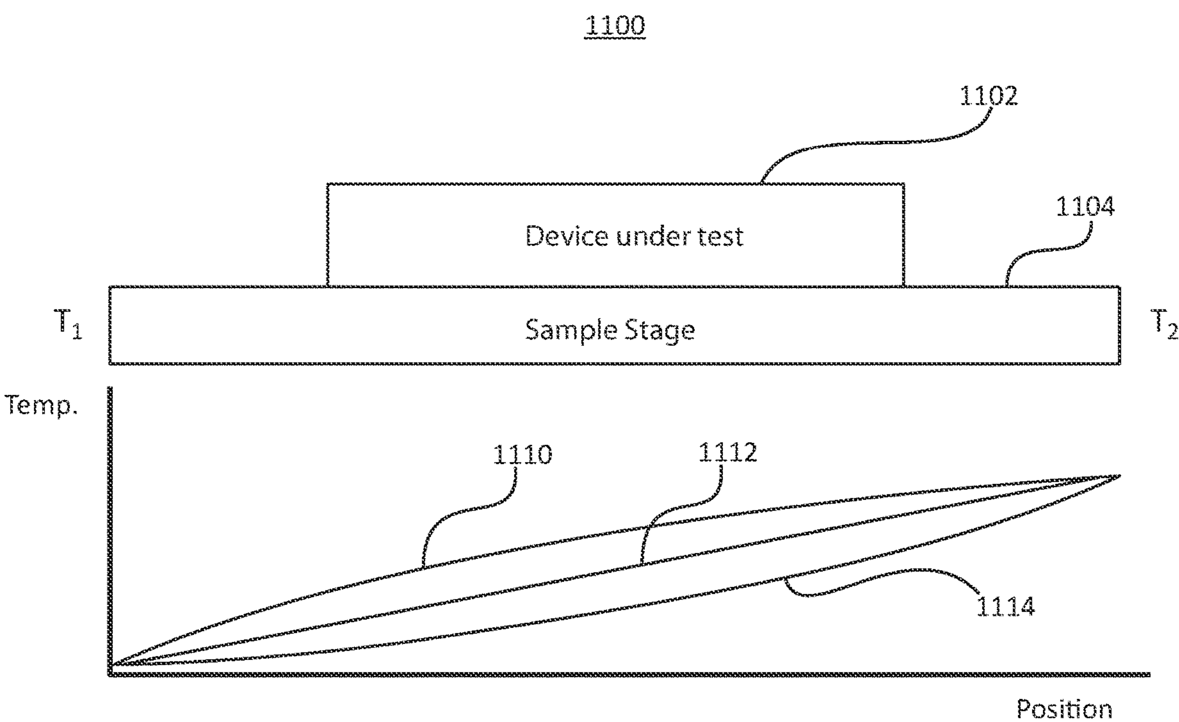
FIG. 10 shows temperature profiles across a sample stage and device under test in accordance with material selection and geometry of the sample stage, in accordance with an embodiment of the present invention.

Referring to FIG. 10, a sample stage 1104 is shown in accordance with another embodiment. The sample stage 1104 supports a device under test 1102. The device under test 1102 is subject to the temperature profile of the sample stage 1104. The sample stage 1104 during measurement under a temperature gradient has different heating/cooling conditions applied to end portions of the sample stage. For example, $T_1$ is applied to one end and $T_2$ is applied to the opposite end. Once equilibrium is reached a temperature profile (e.g., profiles 1110, 1112, 1114) is achieved across the sample stage 1104 which is mimicked by the device under test 1102.

In accordance with embodiment of the present invention, geometry and material selection of the sample stage 1104 can be employed to determine a type of temperature profile experienced by the device under test 1102. For example, the thermal conductivity of the material can be selected to create a linear profile 1112 across the sample stage 1104. In some embodiments, a different profile 1110 or 1114 may be needed to provide a more or less severe gradient profile. In addition, a thickness and cross-sectional area of the sample stage 1104 can be selected to influence the temperature profile as needed.

Figure 11:
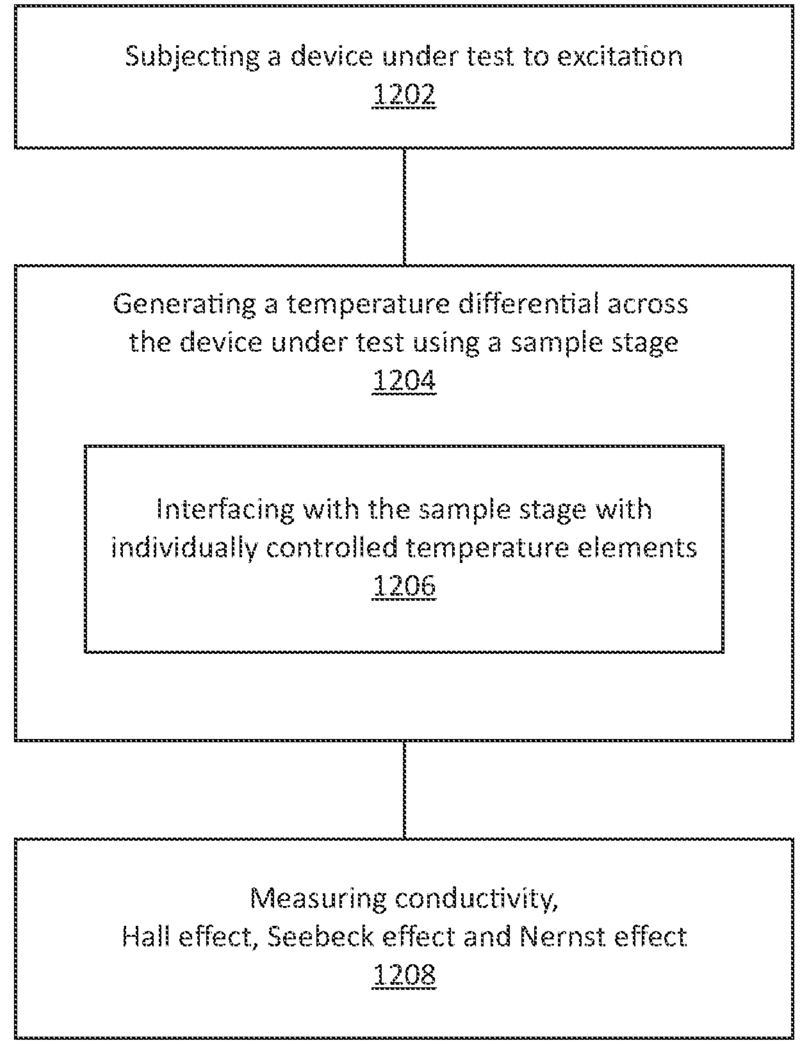
FIG. 11 shows a flow diagram for measuring conductivity ($\sigma$), Seebeck coefficient ($\alpha$), the Hall coefficient (H) and the Nernst coefficient (Q) to determine an effective mass of the charge carrier, in accordance with an embodiment of the present invention.

Referring to FIG. 11, a method for testing or measuring a semiconductor device includes subjecting a device under test to a magnetic field, an electric field and photons from a light source in block 1202. In block 1204, a temperature differential is generated across the device under test by maintaining temperatures across a sample stage which supports the device under test to enable measurements sensitive to thermal gradient conditions. In block 1206, the sample stage includes edge portions which interface with individually controlled temperature elements that provide differential temperatures that result in the temperature gradient across the device under test.

In block 1208, conductivity, Hall effect, Seebeck effect and Nernst effect are measured to determine an effective mass of majority carriers of the device under test. Other measurements and parameters can also be made in accordance with the present embodiments.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Testing methods as described herein can be used in the fabrication and design of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," "top," "bottom" and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements of features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of systems, devices and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A testing system, comprising:
- a magnetic field generator;
- an electric field generator;
- a light source; and
- a temperature control assembly including a sample stage that supports from below a device under test during exposure of the device under test to a magnetic field generated by the magnetic field generator, an electric field generated by the electric field generator, and photons from the light source, wherein:
  - the temperature control assembly generates a temperature gradient across the device under test to enable measurements sensitive to thermal gradient conditions, and
  - the sample stage includes edge portions that interface with individually controlled temperature elements that provide differential temperatures resulting in the temperature gradient across the device under test.

2. The testing system as recited in claim 1, wherein the individually controlled temperature elements include two Peltier stages.

3. The testing system as recited in claim 1, wherein the sample stage includes a thermal conductivity and geometry selected to define a temperature profile of the sample stage.

4. The testing system as recited in claim 1, wherein the magnetic field generator includes a plurality of parallel dipole line magnets rotatable to control total magnetic field at the device under test.

5. The testing system as recited in claim 4, wherein the plurality of parallel dipole line magnets includes one dipole line magnet above the device under test and one dipole line magnet below the device under test.

6. The testing system as recited in claim 4, wherein the plurality of parallel dipole line magnets includes two dipole line magnets above the device under test and one dipole line magnet below the device under test.

7. The testing system as recited in claim 6, wherein the two dipole line magnets above the device under test are separated to permit the photons from the light source to fall incident on the device under test between the two dipole line magnets.

8. The testing system as recited in claim 1, wherein the electric field generator includes circuitry coupled to the device under test.

9. The testing system as recited in claim 1, further comprising a parallel line dipole photo-Hall system to measure conductivity, Hall effect, Seebeck effect, and Nernst effect, wherein the conductivity, the Hall effect, the Seebeck effect, and the Nernst effect are used to measure an effective mass of majority carriers of the device under test.

10. A testing system, comprising:
- a parallel line dipole photo-Hall system to measure conductivity, Hall effect, Seebeck effect, and Nernst effect,
- the parallel dipole line photo-Hall system including a temperature control assembly, the temperature control assembly positioned under a device under test, and the temperature control assembly including:
  - a sample stage that supports the device under test;
  - portions of an intermediary stage, wherein each portion of the portions of the intermediary stage separately supports an end portion of the sample stage; and
  - temperature controlled stages, wherein each temperature controlled stage of the temperature controlled stages interfaces with the portions of the intermediary stage, and the temperature controlled stages individually control respective end portions of the sample stage to generate a temperature gradient across the device under test.

11. The testing system as recited in claim 10, wherein the sample stage includes a thermal conductivity and geometry selected to define a temperature profile of the sample stage.

12. The testing system as recited in claim 10, wherein the parallel line dipole photo-Hall system includes a magnetic field generator having a plurality of parallel dipole line magnets rotatable to adjust a magnetic field at the device under test.

13. The testing system as recited in claim 12, wherein the plurality of parallel dipole line magnets includes one dipole line magnet above the device under test and one dipole line magnet below the device under test.

14. The testing system as recited in claim 12, wherein the plurality of parallel dipole line magnets includes two dipole line magnets above the device under test and one dipole line magnet below the device under test.

15. The testing system as recited in claim 14, wherein the two dipole line magnets above the device under test are separated to permit photons from a light source to fall incident on the device under test between the two dipole line magnets.

16. The testing system as recited in claim 10, wherein the conductivity, the Hall effect, the Seebeck effect, and the Nernst effect are used to measure an effective mass of majority carriers of the device under test.

17. The testing system as recited in claim 10, wherein the temperature controlled stages are each contacted by a temperature-controlled heatsink.

18. A testing system, comprising:
- a processor;
- a memory coupled to the processor;
- a magnetic field generator controlled by the processor to generate a two-dimensional magnetic field vector on a device under test;
- a circuit disposed on the device under test to generate an electric field controlled by the processor;
- a light source controlled by the processor to direct light at the device under test; and
- a temperature control assembly including a sample stage that supports from below the device under test during exposure of the device under test to the two-dimensional magnetic field vector, the electric field, and photons from the light source, the temperature control assembly being controlled by the processor to generate a temperature gradient across the device under test to enable measurements sensitive to thermal gradient conditions.

19. The testing system as recited in claim 18, wherein the sample stage includes edge portions which interface with individually controlled temperature elements that provide differential temperatures that result in the temperature gradient across the device under test.

20. The testing system as recited in claim 18, wherein the magnetic field generator includes a plurality of parallel dipole line magnets rotatable to adjust a magnetic field at the device under test.

21. The testing system as recited in claim 18, further comprising a parallel line dipole photo-Hall system to measure conductivity, Hall effect, Seebeck effect, and Nernst effect, wherein the conductivity, the Hall effect, the Seebeck effect, and the Nernst effect are used to measure an effective mass of majority carriers of the device under test.

22. A method for measuring a semiconductor device, the method comprising:

subjecting a device under test to a magnetic field, an electric field, and photons from a light source; and generating, a temperature differential across the device under test by maintaining temperatures across a sample stage that supports the device under test during the subjecting to enable measurements sensitive to thermal gradient conditions, wherein the sample stage includes edge portions that interface with individually controlled temperature elements that provide differential temperatures resulting in a temperature gradient across the device under test.

23. The method as recited in claim 22, further comprising measuring conductivity, Hall effect, Seebeck effect, and Nernst effect, associated with the device under test, wherein the conductivity, the Hall effect, the Seebeck effect, and the Nernst effect are measured to determine an effective mass of majority carriers of the device under test, and the measurements sensitive to the thermal gradient conditions include the effective mass.

* * * * *